US011462552B2

(12) United States Patent
Loy et al.

(10) Patent No.: US 11,462,552 B2
(45) Date of Patent: Oct. 4, 2022

(54) SEMICONDUCTOR DEVICES WITH MEMORY CELLS

(71) Applicant: GLOBALFOUNDRIES Singapore Pte. Ltd., Singapore (SG)

(72) Inventors: Desmond Jia Jun Loy, Singapore (SG); Wei Chang, Hsinchu (TW); Eng Huat Toh, Singapore (SG); Shyue Seng Tan, Singapore (SG)

(73) Assignee: GlobalFoundries Singapore Pte. Ltd., Singapore (SG)

(*) Notice: Subject to any disclaimer, the term of this patent is extended or adjusted under 35 U.S.C. 154(b) by 109 days.

(21) Appl. No.: 17/146,439

(22) Filed: Jan. 11, 2021

(65) Prior Publication Data

US 2022/0223609 A1 Jul. 14, 2022

(51) Int. Cl.
*H01L 23/528* (2006.01)
*H01L 45/00* (2006.01)
*H01L 27/112* (2006.01)

(52) U.S. Cl.
CPC ...... *H01L 27/11206* (2013.01); *H01L 23/528* (2013.01); *H01L 45/04* (2013.01); *H01L 45/122* (2013.01); *H01L 45/16* (2013.01); *H01L 45/1641* (2013.01)

(58) Field of Classification Search
CPC ....... H01L 45/04; H01L 45/16; H01L 45/122; H01L 45/1641; H01L 29/685; H01L 23/647; H01L 2924/1435; G06F 12/0238
See application file for complete search history.

(56) References Cited

U.S. PATENT DOCUMENTS

| 7,423,903 | B2 | 9/2008 | Lin et al. | |
|---|---|---|---|---|
| 2010/0188877 | A1* | 7/2010 | Hanzawa | G11C 11/1673 365/63 |
| 2011/0068409 | A1* | 3/2011 | Kim | H01L 27/2454 257/E27.081 |
| 2016/0028009 | A1* | 1/2016 | Tan | H01L 45/144 257/2 |
| 2017/0077175 | A1* | 3/2017 | Ueda | H01L 23/528 |
| 2021/0217859 | A1* | 7/2021 | Chang | H01L 29/41725 |

OTHER PUBLICATIONS

Liu et al. Gate Induced Resistive Switching in 1T1R Structure with Improved Uniformity and Better Data Retention, IEEE Xplore (Year: 2014).*
Zahoor et al. Resistive Random Access Memory (RRAM): an Overview of Materials, Switching Mechanism, Performance, Multilevel Cell Storage, Modeling, and Applications, Nanoscale Research Letters, 2020, pp. 1-26 (Year: 2020).*

(Continued)

*Primary Examiner* — Galina G Yushina
(74) *Attorney, Agent, or Firm* — David Cain

(57) ABSTRACT

The present disclosure generally relates to semiconductor devices, and more particularly, to semiconductor devices having memory cells for multi-bit programming and methods of forming the same. The present disclosure also relates to a method of forming such semiconductor devices. The disclosed semiconductor devices may achieve a smaller cell size as compared to conventional devices, and therefore increases the packing density of the disclosed devices.

20 Claims, 14 Drawing Sheets

(56) References Cited

OTHER PUBLICATIONS

Woan Yun Hsiao et al., A New High-Density Twin-Gate Isolation One-Time Programmable Memory Cell in Pure 28-nm CMOS Logic Process, IEEE Transactions on Electron Devices, Jan. 2015, 121-127, vol. 62, No. 1, IEEE, New Jersey, US.
A. Villaret et al., W/Ta2O5/TaN MIM capacitor for High Density One Time Programmable Memory, 2007, 230-233, IEEE, New Jersey, US.
Ping Chun Peng et al., High-Density FinFET One-Time Programmable Memory Cell With Intra-Fin-Cell-IIsolation Technology, IEEE Electron Device Letters, Oct. 2015, 1037-1039, vol. 36, No. 10, IEEE, New Jersey, US.
Kai Ping Huang et al., 1-kb FinFET Dielectric Resistive Random Access Memory Array in 1xnm CMOS Logic Technology for Embedded Nonvolatile Memory Applications, IEEE Transactions on Electron Devices, Nov. 2016, 4273-4278, vol. 63, No. 11, IEEE, New Jersey, US.

\* cited by examiner

View Y-Y'

View Y-Y'

View Y-Y'

View Y-Y'

View Y-Y'

SEMICONDUCTOR DEVICES WITH MEMORY CELLS

FIELD OF THE INVENTION

The disclosed subject matter relates generally to semiconductor devices, and more particularly to semiconductor devices having memory cells for multi-bit programming and methods of forming the same.

BACKGROUND

Semiconductor devices and integrated circuit (IC) chips have found numerous applications in the fields of physics, chemistry, biology, computing, and memory devices. An example of a memory device is a non-volatile (NV) memory device. NV memory devices are programmable and have been extensively used in electronic products due to their ability to retain data for long periods of time.

NV memory devices may be categorized based on their read/write mechanism. Exemplary categories for NV memory may include resistive random-access memory (ReRAM), erasable programmable read-only memory (EPROM), flash memory, ferroelectric random-access memory (FeRAM), and magnetoresistive random-access memory (MRAM). NV memory devices may be built with device components such as transistors (e.g., fin-shaped field-effect transistors (FinFETs), ferroelectric field-effect transistors (FeFETs), complementary metal-oxide semiconductor (CMOS) transistors), and capacitors (e.g., metal-insulator-metal (MIM) capacitors).

NV memory devices may be built in the form of memory cells, each cell storing bits of binary information and may be operated by bit lines, word lines, and/or source lines. These devices may also be programmed using one-time programmable (OTP) or multi-time programmable (MTP) technologies. However, devices programmed using OTP/MTP technologies are found to have large cell sizes, which can be disadvantageous as large cell sizes lower the packing density of device components in IC chips.

SUMMARY

In an aspect of the present disclosure, there is provided a semiconductor device including an isolation region on a substrate, a first row of gates and diffusion blocks on the isolation region. Each gate is arranged between two diffusion blocks and includes a dielectric layer conforming to sides and a bottom of a gate structure, in which the dielectric layer contacts the two diffusion blocks in the first row. The semiconductor device also includes a first diffusion structure and a second diffusion structure on the isolation region, the first and second diffusion structures extending along a length of the isolation region, in which the first row of gates and diffusion blocks are arranged between the first diffusion structure and the second diffusion structure, and the dielectric layer of each gate contacts the first diffusion structure and the second diffusion structure.

In another aspect of the present disclosure, there is provided a semiconductor device including an isolation structure on a substrate, and a gate on the isolation region. The gate includes a dielectric layer conforming to sides and a bottom of a gate structure. The semiconductor device also includes two diffusion blocks and two diffusion structures on the isolation region, in which the gate is arranged between the two diffusion structures and the two diffusion blocks, and the dielectric layer of the gate contacts each of the two diffusion structures and each of the two diffusion blocks.

In yet another aspect of the present disclosure, there is provided a method of forming a semiconductor device by forming an isolation region on a substrate, forming a first row of gates and diffusion blocks on the isolation region, in which each gate is formed between two diffusion blocks and includes a dielectric layer that conforms to sides and a bottom of a gate structure. The dielectric layer contacts the two diffusion blocks in the first row. The method also includes forming a first diffusion structure and a second diffusion structure on the isolation region, the first and second diffusion structures extending along a length of the isolation region, in which the first row of gates and diffusion blocks are formed between the first diffusion structure and the second diffusion structure, and the dielectric layer of each gate contacts the first diffusion structure and the second diffusion structure.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

FIGS. 5A through 9B depict structures of a semiconductor device at various stages of forming the semiconductor device.

FIG. 5A is a top-down view and FIG. 5B is a cross-sectional view depicting a device structure for forming a semiconductor device. FIG. 5B is a cross-sectional view taken along section line Y-Y' in FIG. 5A.

FIG. 6B is a cross-sectional view taken along section line Y-Y' in FIG. 6A.

FIG. 7B is a cross-sectional view taken along section line Y-Y' in FIG. 7A.

FIG. 8B is a cross-sectional view taken along section line Y-Y' in FIG. 8A.

FIG. 9A is a top-down view and FIG. 9B is a cross-sectional view depicting the formation of gates in openings formed in the patterned conductive material shown in FIGS. 8A and 8B. FIG. 9B is a cross-sectional view taken along section line Y-Y' in FIG. 9A.

DETAILED DESCRIPTION

Various illustrative embodiments of the present disclosure are described below. The embodiments disclosed herein are exemplary and not intended to be exhaustive or limiting to the present disclosure.

Figure 1A:
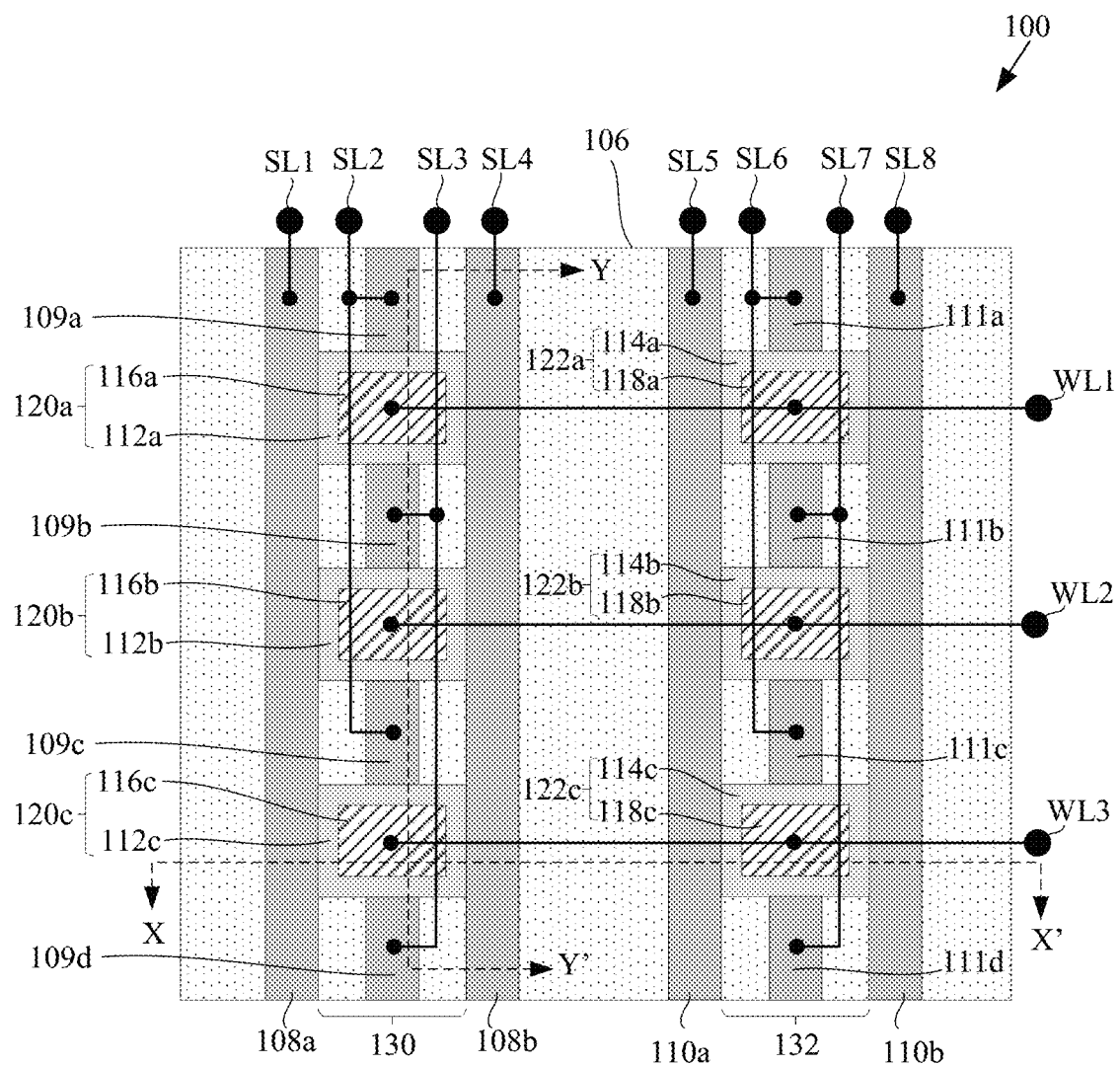
FIG. 1A is a top-down view of an example of a semiconductor device.
Figure 1B:
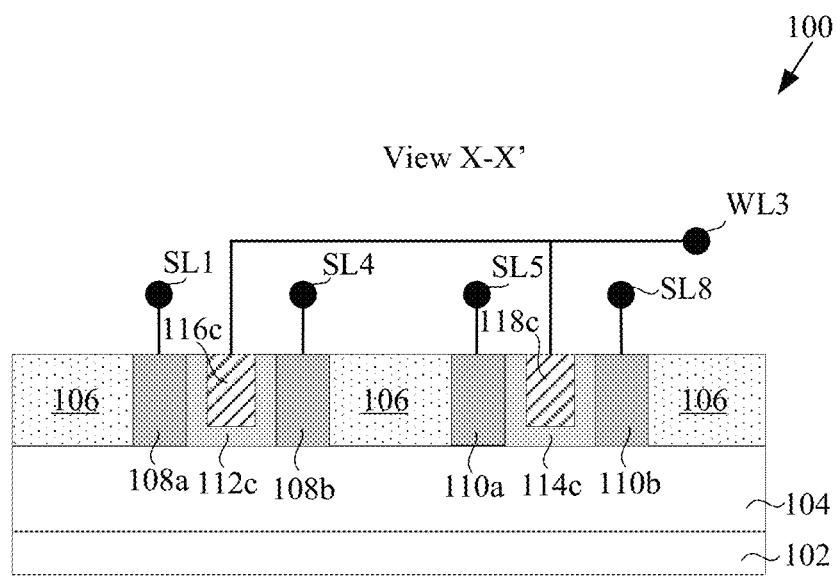
FIG. 1B is a cross-sectional view of the example semiconductor device taken along line X-X' in FIG. 1A.
Figure 1C:
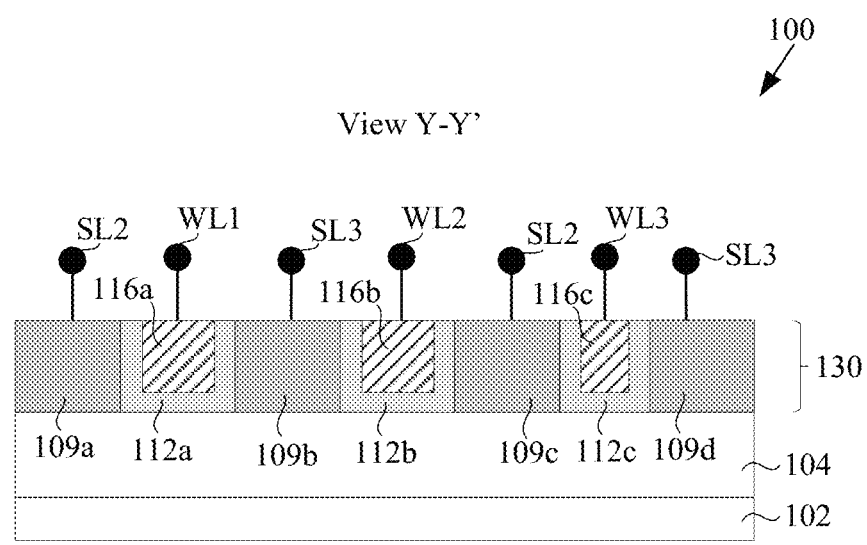
FIG. 1C is a cross-sectional view of the example semiconductor device taken along line Y-Y' in FIG. 1A.

Referring to FIG. 1A, FIG. 1B, and FIG. 1C, an exemplary semiconductor device 100 is shown. FIG. 1A is a simplified top-down view illustrating an example configuration of the exemplary semiconductor device 100. The line X-X' indicates the section line from which the view in FIG. 1B is taken, and the line Y-Y' indicates the section line from which the view in FIG. 1C is taken. In the simplified view of FIG. 1A, the isolation region 104 and the substrate 102 are not shown, however, it should be understood that the configuration in FIG. 1A is positioned upon the isolation region 104.

As shown in FIG. 1A, FIG. 1B, and FIG. 1C, the device 100 may include a substrate 102, an isolation region 104 disposed on the substrate 102, and a dielectric region 106 disposed on the isolation region 104. A first row 130 of gates 120a, 120b, 120c and diffusion blocks 109a, 109b, 109c, 109d and a second row 132 of gates 122a, 122b, 122c and diffusion blocks 111a, 111b, 111c, 111d may be located on the isolation region 104. The gates and the diffusion blocks in the first row 130 and the second row 132 may be arranged along a length of the isolation region 104.

The gates and the diffusion blocks in the first row 130 and the second row 132 may be arranged in an alternating manner. In particular, each gate 120a, 120b, 120c in the first row 130 may be arranged between two diffusion blocks (109a and 109b, 109b and 109c, 109c and 109d, respectively) in the first row 130, and each gate 122a, 122b, 122c in the second row 132 may be arranged between two diffusion blocks (111a and 111b, 111b and 111c, 111c and 111d, respectively) in the second row 132. For example, in the first row 130, gate 120a is in between two diffusion blocks 109a and 109b, gate 120b is in between two diffusion blocks 109b and 109c, and gate 120c is in between two diffusion blocks 109c and 109d.

Each gate 120a, 120b, 120c in the first row 130 and each gate 122a, 122b, 122c in the second row 132 may comprise a dielectric layer 112, 114 conforming to sides and a bottom of a gate structure 116, 118. The dielectric layer 112a, 112b, 112c of each gate (120a, 120b, 120c, respectively) in the first row 130 may contact the two diffusion blocks in the first row 130. Similarly, the dielectric layer 114a, 114b, 114c of each gate (122a, 122b, 122c, respectively) in the second row 132 may contact the two diffusion blocks in the second row 132. For example, in the first row 130, dielectric layer 112a contacts the two diffusion blocks 109a and 109b, dielectric layer 112b contacts the two diffusion blocks 109b and 109c, and dielectric layer 112c contacts the two diffusion blocks 109c and 109d.

A first diffusion structure 108a, a second diffusion structure 108b, a third diffusion structure 110a, and a fourth diffusion structure 110b are disposed on the isolation region 104. The first, second, third, and fourth diffusion structures (108a, 108b, 110a, 110b, respectively) may extend along the length of the isolation region 104. The first row 130 of gates 120a, 120b, 120c and diffusion blocks 109a, 109b, 109c, 109d may be arranged between the first diffusion structure 108a and the second diffusion structure 108b. The dielectric layer 112a, 112b, 112c of each gate (120a, 120b, 120c, respectively) in the first row 130 may contact the first diffusion structure 108a and the second diffusion structure 108b. Similarly, the second row 130 of gates 122a, 122b, 122c and diffusion blocks 111a, 111b, 111c, 111d may be arranged between the third diffusion structure 110a and the fourth diffusion structure 110b. The dielectric layer 114a, 114b, 114c of each gate (122a, 122b, 122c, respectively) in the second row 132 may contact the third diffusion structure 110a and the fourth diffusion structure 110b.

Each diffusion structure 108a, 108b, 110a, 110b, each diffusion block 109a, 109b, 109c, 109d, 111a, 111b, 111c, 111d, and each gate 120a, 120b, 120c, 122a, 122b, 122c, 122d located on the isolation region 104 may be connected to a conductive line. The conductive line may be made of copper, aluminum, cobalt, or an alloy thereof. The conductive lines that connect to the diffusion structures, the diffusion blocks, and the gates may be configured as source lines, word lines, and bit lines. As used herein, the terms "source line(s)", "bit line(s)", and "word line(s)" refers to electrical terminal connections that link memory cells in a device circuit.

As described above, each gate 120a, 120b, 120c in the first row 130 and each gate 122a, 122b, 122c in the second row 132 may be arranged between two diffusion blocks. The two diffusion blocks that contact the respective dielectric layer of each gate 120a, 120b, 120c in the first row 130 and each gate 122a, 122b, 122c in the second row 132 may be connected to different conductive lines. For example, in the first row 130, gate 120a is arranged between two diffusion blocks 109a and 109b. Diffusion block 109a may be connected to source line SL2, while diffusion block 109b may be connected to source line SL3. Additionally, gate 120b is arranged between two diffusion blocks 109b and 109c. Diffusion block 109b may be connected to source line SL3, while diffusion block 109c may be connected to source line SL2.

A conductive line may connect one of the gates 120a, 120b, 120c in the first row 130 and one of the gates 122a, 122b, 122c in the second row 132. For example, word line WL1 may connect gate 120a in the first row 130 and gate 122a in the second row 132, word line WL2 may connect gate 120b in the first row 130 and gate 122b in the second row 132, and word line WL3 may connect gate 120c in the first row 130 and gate 122c in the second row 132.

The first diffusion structure 108a, the second diffusion structure 108b, the third diffusion structure 108c, and the fourth diffusion structure 108d may be individually connected to a conductive line. The conductive lines that connect the first, second, third, and fourth diffusion structures (108a, 108b, 110a, 110b, respectively) may be different from the conductive lines that connect the diffusion block 109 in the first row 130 and the diffusion blocks 111 in the second row 132.

With reference to the example in FIG. 1A, source line SL1 may be connected to the first diffusion structure 108a, source line SL2 may be connected to a first of the two diffusion blocks in the first row 130 (e.g., diffusion blocks 109a, 109c), source line SL3 may be connected to a second of the two diffusion blocks in the first row 130 (e.g., diffusion blocks 109b, 109d), and source line SL4 may be connected to the second diffusion structure 108b. Similarly, source line SL5 may be connected to the third diffusion structure 110a, source line SL6 may be connected to a first of the two diffusion blocks in the second row 132 (e.g., diffusion blocks 111a, 111c), source line SL7 may be connected to a second of the two diffusion blocks in the second row 132 (e.g., diffusion blocks 111b, 111d), and source line SL8 may be connected to the fourth diffusion structure 110b.

Although not shown in the accompanying drawings, it should be noted that alternative ways of configuring terminal connections (e.g., source lines, word lines, bit lines) to the diffusion structures and the gate are contemplated within the scope of the disclosure. For example, the diffusion structures 108, 110 and diffusion blocks 109, 111 may alternatively be connected to word lines or bit lines, while the gates 120, 122 may be connected to source lines or bit lines.

Also shown in FIG. 1A, each gate 120a, 120b, 120c in the first row 130, and each gate 122a, 122b, 122c in the second row 132 may be electrically coupled to two diffusion structures and two diffusion blocks. The two diffusion structures and two diffusion blocks that are coupled to each gate 120a, 120b, 120c in the first row 130, and the two diffusion structures and the two diffusion blocks that are coupled to each gate 122a, 122b, 122c in the second row 132 may be connected to different source lines. Each gate 120a, 120b, 120c in the first row 130 may be connected to the same word line as a corresponding gate 122a, 122b, 122c in the second row 132.

Each gate 120a, 120b, 120c in the first row 130 and each gate 122a, 122b, 122c in the second row 132 may be configured to receive a voltage to control an electrical characteristic (e.g., conductance) of at least one of the diffusion structures and diffusion blocks that is in contact with the dielectric layer of each gate. As an illustrative example, gate 120a may be configured to connect to word line WL1. The dielectric layer 112a has resistive properties and electrically insulates the gate structure 116a from the diffusion structures 108a, 108b, and the diffusion blocks 109a, 109b. A voltage may be applied to the gate structure 116a and an electric field may be generated across the dielectric layer 112a. The generated electric field may enable the gate structure 116a to modulate the conductance of the diffusion structures 108a, 108b, and the diffusion blocks 109a, 109b. The resistance value of the dielectric layer 112a and the voltage supplied to the gate structure 116a may be optimized or adjusted for the control of the electrical characteristic of the diffusion structures 108a, 108b, and the diffusion blocks 109a, 109b.

Advantageously, the device of the present disclosure may achieve a smaller cell size as compared to conventional devices. For example, as shown in FIG. 1A, the configuration of a single gate electrically coupled with at least two diffusion structures and two diffusion blocks may provide a memory cell with at least four bits, which may reduce the size of each cell in the device (e.g., each cell may be less than $38F^2$) and increase the packing density of device components in IC chips, thereby resulting in higher performance of the chips (e.g., faster processing speed).

Additionally, the packing density of the device components in the IC chips can be further increased by arranging the gates 120, 122 and the diffusion blocks 109, 111 in an alternating arrangement in the first row 130 and the second row 132, e.g., a gate is arranged between every two diffusion structures in the first row 130 and the second row 132. Therefore, the configuration of alternating gates and diffusion blocks in the first row 130 and the second row 132 may enable devices to be fabricated with multiple memory cells, each cell having at least four bits.

The substrate 102 may be made of any semiconductor material, such as silicon, germanium, silicon germanium (SiGe), silicon carbide, and those consisting essentially of III-V compound semiconductors, such as GaAs, II-VI compound semiconductors such as ZnSe. The substrate 102 may also be a semiconductor-on-insulator substrate or a bulk semiconductor substrate. Examples of a semiconductor-on-insulator substrate may include, but are not limited to, an organic semiconductor or a layered semiconductor, such as Si/SiGe, a silicon-on-insulator (SOI), a germanium-on-insulator (GOI), or a SiGe-on-insulator. A portion, or the entire semiconductor substrate 102 may be amorphous, polycrystalline, or monocrystalline.

The isolation region 104 may contain an oxide material such as silicon dioxide. Several isolation regions 104 may be formed on the substrate 102. The isolation region 104 may be a shallow trench isolation region or a deep trench isolation region. Although not shown in the accompanying drawings, other IC components such as bipolar junction transistors (BJTs) and/or field-effect transistors (FETs) may be built on the substrate 102 and separated by the isolation regions 104.

The dielectric region 106 may embed the diffusion structures 108a, 108b, 110a, 110b, the diffusion blocks 109a, 109b, 109c, 109d, 111a, 111b, 111c, 111d, and the gates 120, 122 as well as other interconnect features, such as conductive lines. For example, the dielectric region 106 may be inter-metal dielectric (IMD) layers or a "metallization level", and may function as an electrical insulator to prevent electrical shorts between the diffusion structures 108a, 108b, 110a, 110b, and the diffusion blocks 109a, 109b, 109c, 109d, 111a, 111b, 111c, 111d. The dielectric region 106 may include a dielectric material such as, but not limited to, silicon dioxide, tetraethyl orthosilicate (TEOS), or a material having a chemical composition of $SiC_xO_yH_z$, wherein x, y, and z are in stoichiometric ratio.

The diffusion structures 108a, 108b, 110a, 110b, and the diffusion blocks 109a, 109b, 109c, 109d, 111a, 111b, 111c, 111d that are located on the isolation region 104 may function as a channel or a pathway for current flow (i.e., diffusion of electrons or electrical charges) and may be made of a conductive material. Exemplary conductive materials for the diffusion structures and the diffusion blocks may include, but are not limited to, a crystalline material such as polycrystalline silicon, amorphous silicon, polycrystalline germanium, amorphous germanium, polycrystalline silicon-germanium, or amorphous silicon-germanium, or a metallic material such as tungsten, cobalt, nickel, copper, aluminum, or an alloy thereof. In some embodiments, the diffusion structures 108a, 108b, 110a, 110b, and the diffusion blocks 109a, 109b, 109c, 109d, 111a, 111b, 111c, 111d may be referred to as "poly lines".

As described above, each gate 120, 122 may include a dielectric layer 112, 114 and a gate structure 116, 118. In some embodiments, each gate structure 116, 118 in the respective gates 120, 122 may be peripherally enclosed by the respective dielectric layers 112, 114. The dielectric layers 112, 114 may include an oxide-containing dielectric material. The oxide-containing dielectric material may be made of a high-K dielectric material or silicon dioxide ($SiO_2$).

The term "high-K" as used herein refers to a material having a dielectric constant (i.e., K value) that is greater than 5, preferably between 25 to 30. The high-K dielectric material may include, but not limited to, tantalum pentoxide ($Ta_2O_5$), magnesium oxide (MgO), hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride ($La_2O_xN_y$), aluminum oxynitride ($Al_2O_xN_y$), titanium oxynitride ($TiO_xN_y$), strontium titanium oxynitride ($SrTiO_xN_y$), lanthanum aluminum oxynitride ($LaAlO_xN_y$), yttrium oxynitride ($Y_2O_xN_y$), a silicate thereof, and an alloy thereof. Each value of x is independently from 0.5 to 3 and each value of y is independently from 0 to 2. The dielectric layers 112, 114 may have thicknesses in the range of about 1 nm to about 20 nm, and preferably about 5 nm to about 10 nm.

The gate structures 116, 118 may further include a metal electrode and a work-function material (WFM) component. The metal electrode may be made of an electrically conductive material. Examples of electrically conductive materials for the metal electrode may include, but are not limited to, tungsten, cobalt, nickel, copper, aluminum.

The WFM component may include any metallic compound or a composition of metallic compounds capable of modifying the work function property of a gate. Examples of metallic compounds may include, but not limited to, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, a stack thereof, a conductive oxide thereof, a conductive nitride thereof, an alloy thereof, and a combination thereof.

Figure 1D:
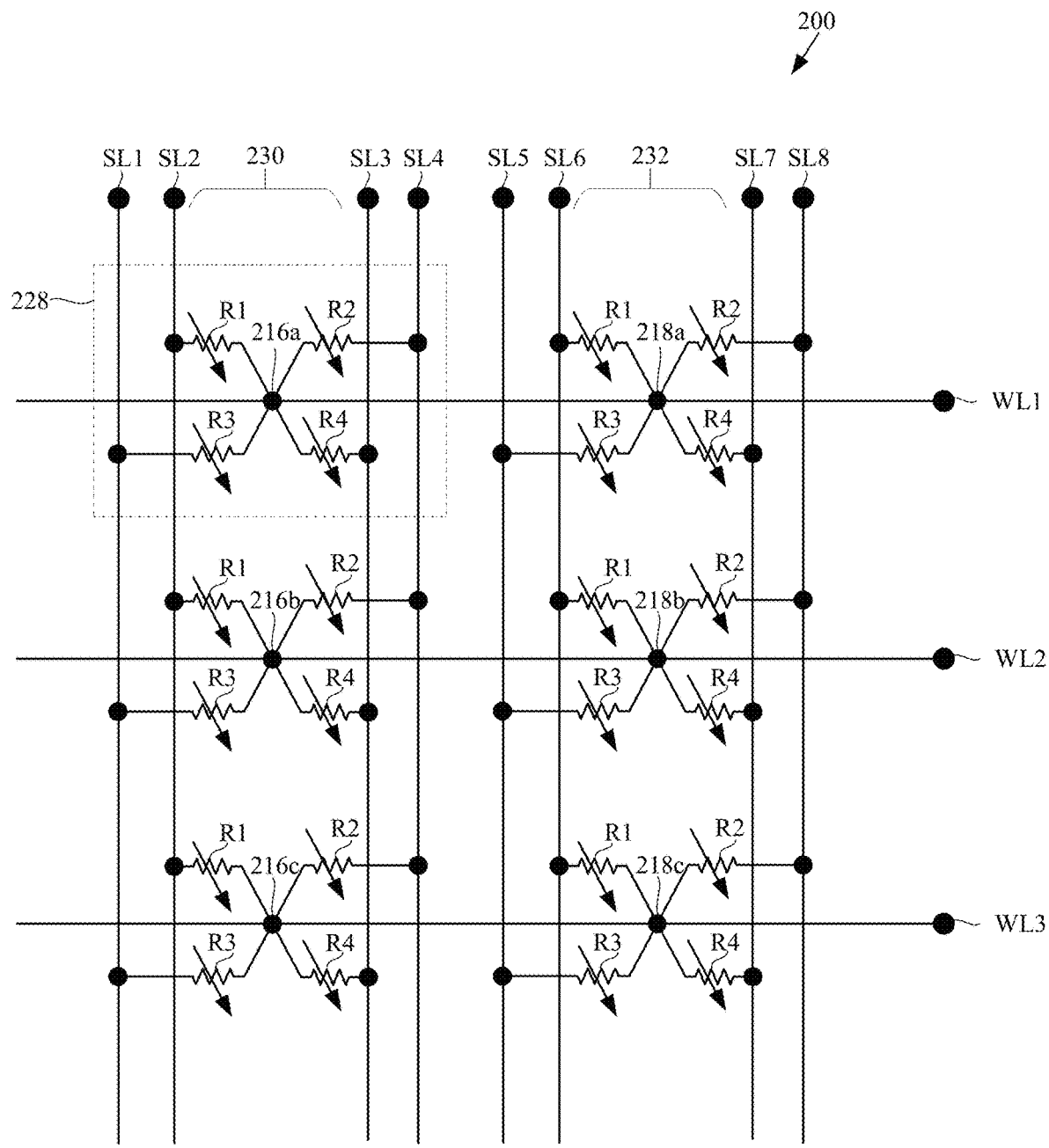
FIG. 1D is a circuit diagram representing the example semiconductor device shown in FIG. 1A.

Referring to FIG. 1D, a circuit diagram 200 depicting the electrical connections in the exemplary semiconductor device 100 of FIGS. 1A-1C is shown. The circuit diagram 200 may include the first row 230 having the gate structures 216a, 216b, 216c, and the second row 132 having the gate structures 218a, 218b, 218c. Each gate structure 216a, 216b, 216c in the first row 230 and each gate 218a, 218b, 218c in the second row 232 are connected to 4 resistors R1, R2, R3, R4. Gate structures 216, 218 in the circuit diagram 200 may correspond to the implementation of the gate structure in each gate in the device 100 shown in FIG. 1A. The 4 resistors R1, R2, R3, R4 that connect each gate structure may correspond to the implementation of the dielectric layer in each gate in the device 100 shown in FIG. 1A.

The circuit diagram 200 may include at least one memory cell. For example, memory cell 228 in the circuit diagram 200 may include one gate structure (e.g., 216a) coupled to four resistors (e.g., R1, R2, R3, R4). Each memory cell may be connected to and operated by four source lines and one word line. As shown in FIG. 1D, each resistor R1, R2, R3, R4 of a memory cell may be connected to a source line. In particular, in the first row 230, source line SL1 may be connected to resistor R3 of each memory cell, source line SL2 may be connected to resistor R1 of each memory cell, source line SL3 may be connected to resistor R4 of each memory cell, and source line SL4 may be connected to resistor R2 of each memory cell. In the second row 232, source line SL5 may be connected to resistor R3 of each memory cell, source line SL6 may be connected to resistor R1 of each memory cell, source line SL7 may be connected to resistor R4 of each memory cell, and source line SL8 may be connected to resistor R2 of each memory cell.

Each gate structure of a memory cell may be connected to a word line. In particular, a first word line WL1 may connect gate structure 216a in the first row 230 and gate structure 218a in the second row 232. A second word line WL2 may connect gate structure 216b in the first row 230 and gate structure 218b in the second row 232. A third word line WL3 may connect gate structure 216c in the first row 230 and gate structure 218c in the second row 232.

Each memory cell in the device may be programmed using OTP or MTP technologies. Additionally, in a multi-level cell application, each memory cell can be programmed as single bit or multi bit, depending on the level of control.

For example, the memory cell 228 may be programmed with at least four bits. The first bit may include the connection between the gate structure 216a, the resistor R1, and the source line SL2. The second bit may include the connection between the gate structure 216a, the resistor R2, and the source line SL4. The third bit may include the connection between the gate structure 216a, the resistor R3, and the source line SL1. The fourth bit may include the connection between the gate structure 216a, the resistor R4, and the source line SL3.

To operate the first bit in the memory cell 228 in the circuit diagram 200, an "operating" voltage may be supplied through the first word line WL1 to the gate structure 216a with source line SL2 as the ground terminal (i.e., zero voltage). The second and third word lines (WL2, WL3, respectively) and the other source lines SL1, SL3, SL4, SL5, SL6, SL7, SL8 may provide "inhibiting" voltages. The inhibiting voltage may be lower than the operating voltage by 50% to enable changes in the resistance state of the resistor R1 (e.g., from a high resistance state to a low resistance state, or from a low resistance state to a high resistance state). For MTP memory cells, the resistance state of R1 may be varied multiple times between low and high resistance states whereas for OTP memory cells, the resistance state of R1 may be varied between low and high resistance states only once.

Similarly, to operate the second bit in the memory cell 228, the operating voltage may be supplied through the first word line WL1 to the gate structure 216a with source line SL3 as the ground terminal. The second and third word lines (WL2, WL3, respectively) and the other source lines SL1, SL2, SL4, SL5, SL6, SL7, SL8 may provide the inhibiting voltages, which enables changes in the resistance state of resistor R2. Likewise, other memory cells in the first row 230 or the second row 232 can be operated in the same manner as the memory cell 228 as described herein.

Advantageously, the present configuration is found to enable the use of a single gate to control the transmission of electrical signals to at least four source lines. Also advantageously, the device of the present disclosure may enable multi-bit programming of memory cells with significant reduction in cell sizes.

Figure 2:
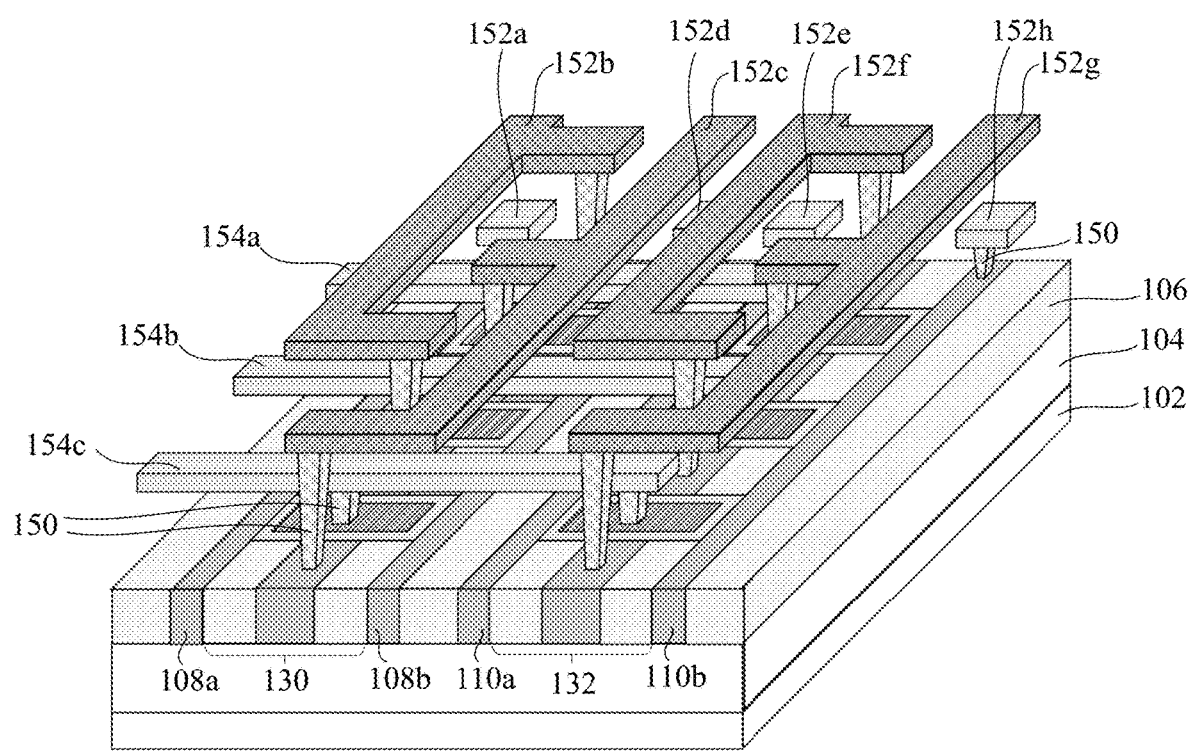
FIG. 2 is a perspective view of the example semiconductor device shown in FIGS. 1A through 1D.

FIG. 2 depicts a perspective view of the exemplary semiconductor device shown in FIGS. 1A to 1C. As shown, interconnect structures may be formed above the device structure to provide routing of electrical signals to and from the gates, the diffusion blocks, and the diffusion structures. The interconnect structures may be made of a metallic material such as copper, cobalt, aluminum, or an alloy thereof.

As shown in FIG. 2, the interconnect structures may include interconnect vias 150 and conductive lines 152a, 152b, 152c, 152d, 152e, 152f, 152g, 152h, 154a, 154b, 154c. The conductive lines 152a, 152b, 152c, 152d, 152e, 152f, 152g, 152h, 154a, 154b, 154c may function as source lines, word lines, or bit lines. In particular, conductive lines 154a, 154b, 154c may be configured as word lines, which are connected to the gate structures 116, 118 through the interconnect vias 150. Conductive lines 152a, 152b, 152c, 152d, 152e, 152f, 152g, 152h may be configured as source lines and are connected to the diffusion structures 108, 110, and the diffusion blocks 109, 111 through the interconnect vias 150.

In the embodiment shown in FIG. 2, conductive lines (e.g. source lines) 152b, 152c, 152f, 152g that connect to the diffusion structures in the first row 130 and the second row 132 may be formed above (e.g., formed at a higher metallization level than) the conductive lines 152a, 152d, 152e, 152h, 154a, 154b, 154c. Conductive lines (e.g., word lines) 154a, 154b, 154c may extend perpendicularly across the first row 130 of gates and diffusion blocks and the second row 132 of gates and diffusion blocks.

Referring to FIG. 3A, FIG. 3B, FIG. 3C, and FIG. 3D, examples of a memory cell 128 in the device of the present disclosure are shown. As described herein, the memory cell 128 may include a gate 120 and at least two diffusion structures 108a, 108b, and two diffusion blocks 109a, 109b disposed upon the isolation region 104. The gate 120 may be arranged between the adjacent diffusion structures 108a, 108b, and diffusion blocks 109a, 109b, and the dielectric layer 112 of the gate 120 may contact each of the diffusion structures 108a, 108b, and diffusion blocks 109a, 109b.

Figure 3A:
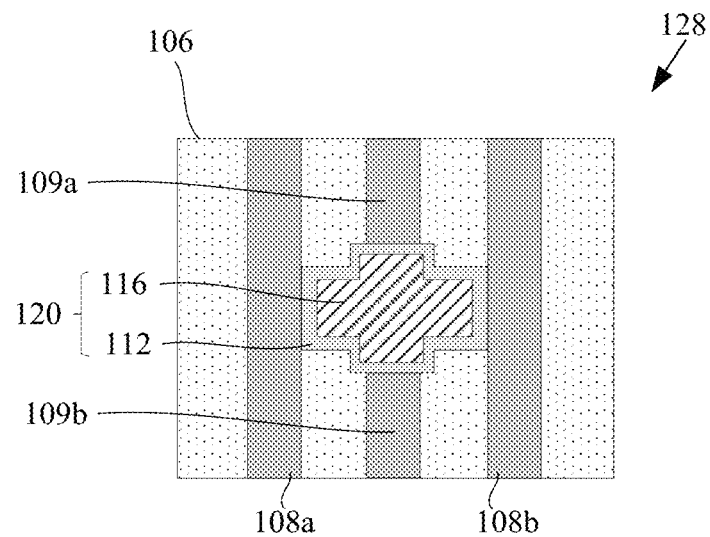
FIG. 3A through 3D are top-down views depicting example arrangements of a gate and diffusion structures within a memory cell of the semiconductor device shown in FIG. 1A.
Figure 3B:
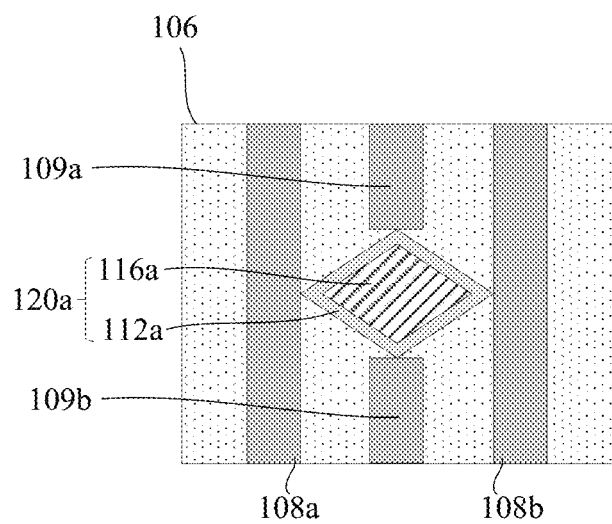
Figure 3C:
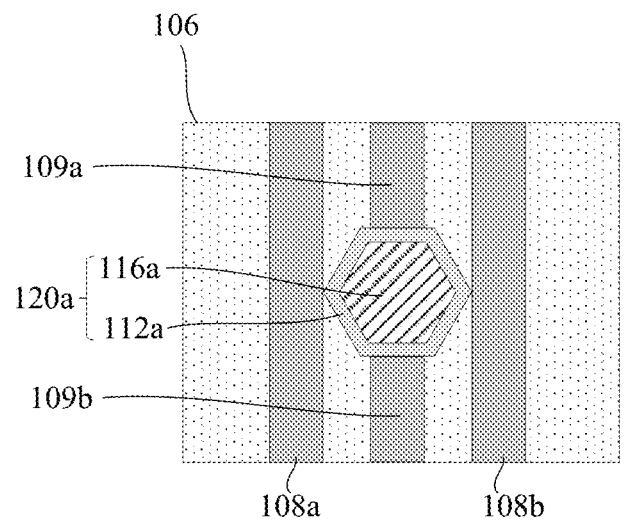
Figure 3D:
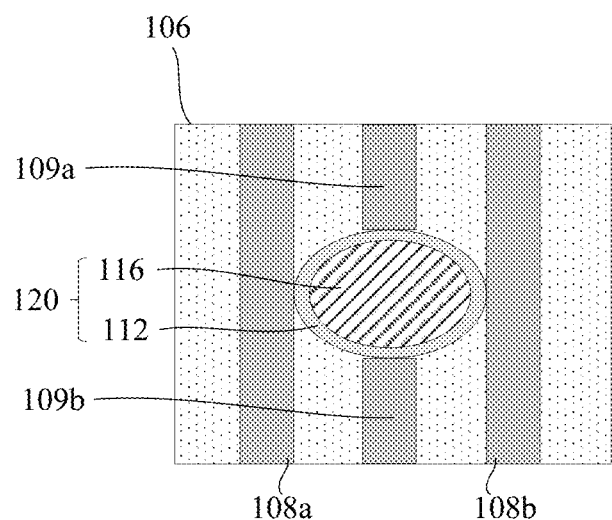

The dielectric layer 112 of the gate 120 may conform to the sides of the gate structure 116. The sides of the gate structure 116 may provide at least four contact points (e.g., surfaces, facets and/or edges) for contact with the adjacent diffusion structures 108a, 108b, and diffusion blocks 109a, 109b. For example, in FIG. 3A and FIG. 1A, the sides of the gate structure 116 may provide at least 4 facets for contact with the adjacent diffusion structures 108a, 108b, and diffusion blocks 109a, 109b. In the example shown in FIG. 3B, the sides of the gate structure 116 may provide at least 4 edges for contact with the adjacent diffusion structures 108a, 108b, and diffusion blocks 109a, 109b. In the example shown in FIG. 3C, the sides of the gate structure 116 may provide at least 2 facets and at least 2 edges for contact with the adjacent diffusion structures 108a, 108b, and diffusion blocks 109a, 109b. Alternatively, as shown in FIG. 3D, the sides of the gate structure 116 may form a circumferential surface for contact with the adjacent diffusion structures 108a, 108b, and diffusion blocks 109a, 109b.

Figure 4A:
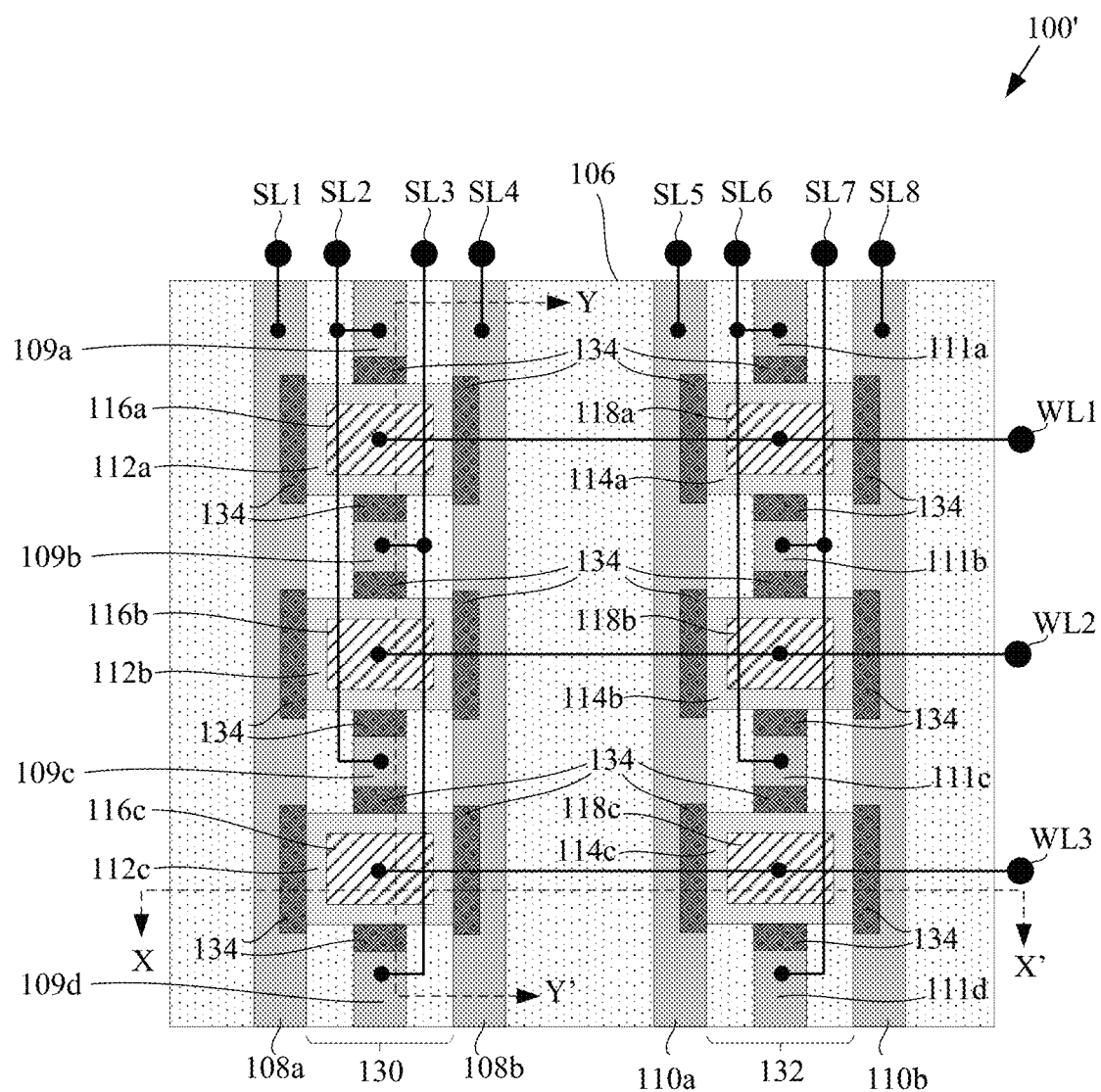
FIG. 4A is a top-down view of another example of a semiconductor device.
Figure 4B:
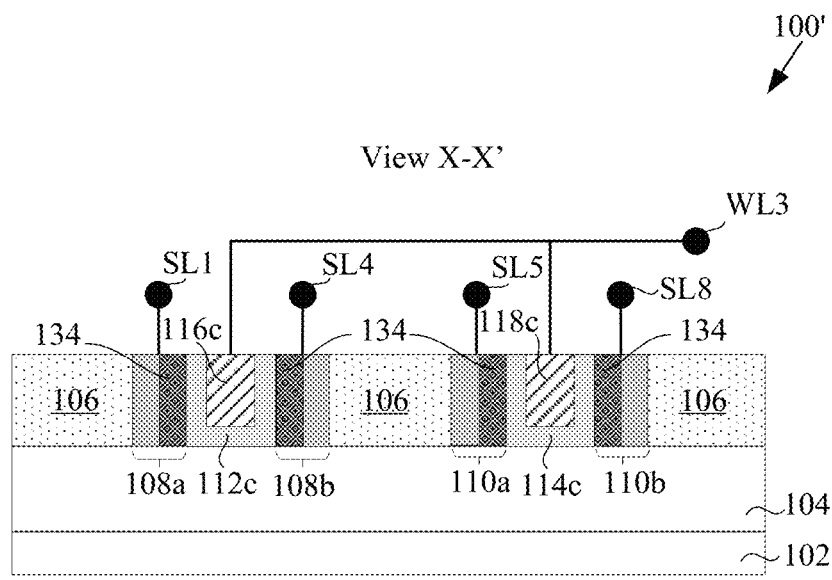
FIG. 4B is a cross-sectional view of the example semiconductor device taken along line X-X' in FIG. 3A.
Figure 4C:
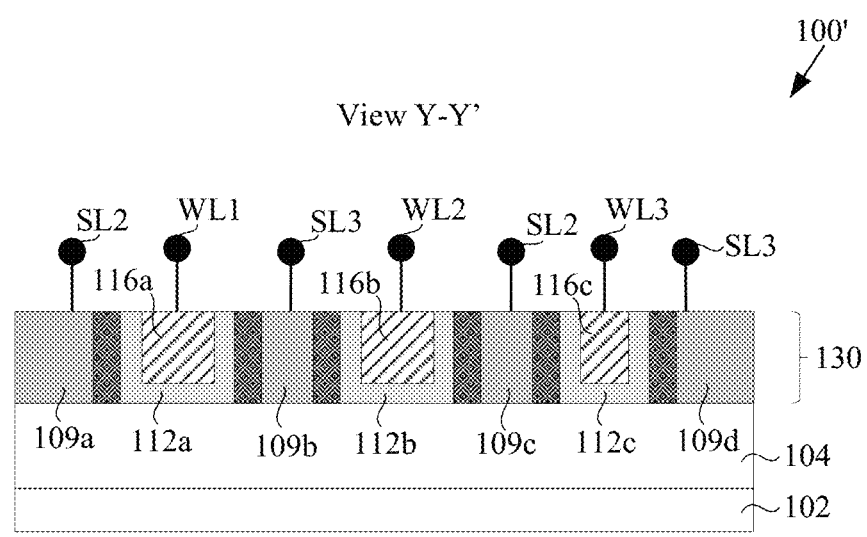
FIG. 4C is a cross-sectional view of the example semiconductor device taken along line Y-Y' in FIG. 4A.

Referring to FIG. 4A, FIG. 4B, and FIG. 4C, another exemplary semiconductor device 100' is shown. FIG. 4A is a simplified top-down view illustrating an example configuration of the exemplary semiconductor device 100'. The line X-X' indicates the section line from which the view in FIG. 4B is taken, and the line Y-Y' indicates the section line from which the view in FIG. 4C is taken. In the simplified view of FIG. 4A, the isolation region 104 and the substrate 102 are not shown, however, it should be understood that the configuration in FIG. 4A is positioned upon the isolation region 104.

The structures shown in FIG. 4A, FIG. 4B, and FIG. 4C are similar to those of FIG. 1A, FIG. 1B, and FIG. 1C, respectively, except that in FIG. 4A, FIG. 4B, and FIG. 4C, the first diffusion structure 108a, the second diffusion structure 108b, the third diffusion structure 110a, the fourth diffusion structure 110b, each diffusion block 109a, 109b, 109c, 109d in the first row 130, and each diffusion block 111a, 111b, 111c, 111d in the second row 132 may include at least one doped region 134. The doped region 134 of each diffusion structure 108a, 108b, and each diffusion block 109a, 109b, 109c, 109d may contact the dielectric layer of each respective gate 122a, 122b, 122c in the first row 130. Similarly, the doped region 134 of each diffusion structure 110a, 110b, and each diffusion block 111a, 111b, 111c, 111d may contact the dielectric layer of each respective gate 122a, 122b, 122c in the second row 132.

The doped region 134 may be of N-type or P-type conductivity. Exemplary dopants for N-type conductivity doping may include, but are not limited to, arsenic, phosphorus, or antimony. Exemplary dopants for P-type conductivity doping may include, but are not limited to, boron, aluminum, or gallium. Advantageously, the doped region 134 may enable selective control of transmission of electrical signals between the word lines WL1, WL2, WL3 and the source lines SL1, SL2, SL3, SL4, SL5, SL6, SL7, SL8.

FIGS. 5A through 9B show example structures associated with steps that may be used to create the semiconductor devices as described above.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure or opening. Examples of techniques for patterning include, but not limited to, wet etch lithographic processes, dry etch lithographic processes or direct patterning processes.

Figure 5A:
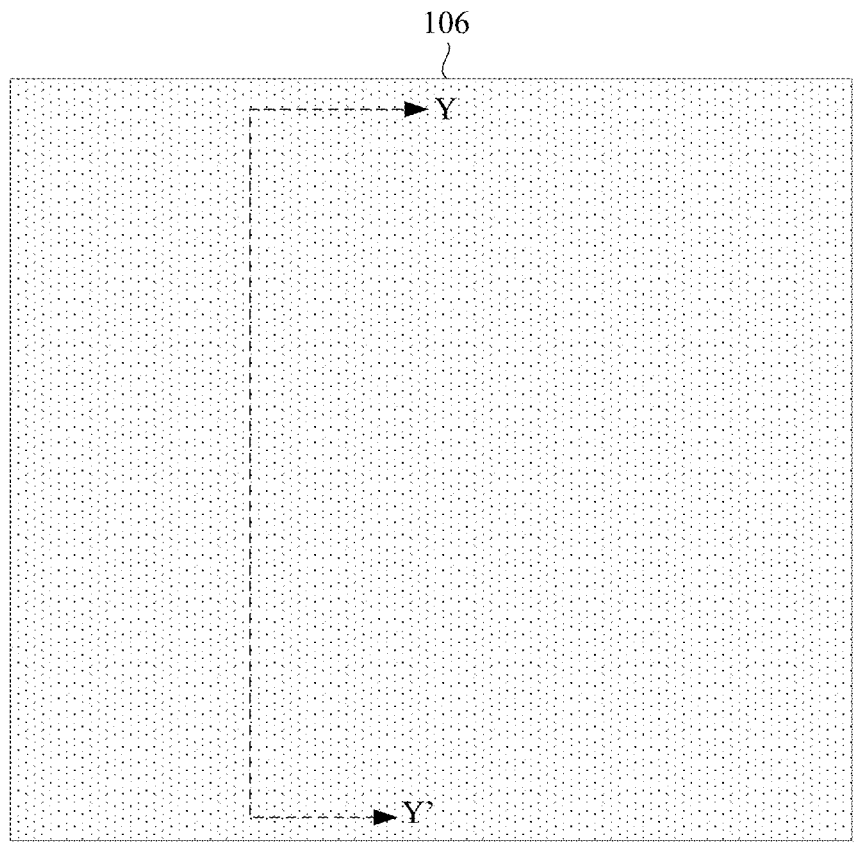
Figure 5B:
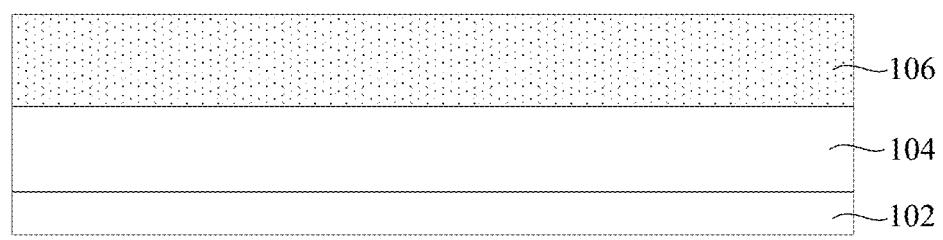

FIG. 5A illustrates the top-down view of the device structure and FIG. 5B illustrates the cross-sectional view of FIG. 5A along the line Y-Y'. Referring to FIG. 5A and FIG. 5B, a device structure for forming a semiconductor device of the present disclosure is shown. The device structure may have a substrate 102, an isolation region 104 formed on the substrate 102, and a dielectric region 106 formed on the isolation region 104.

Figure 6A:
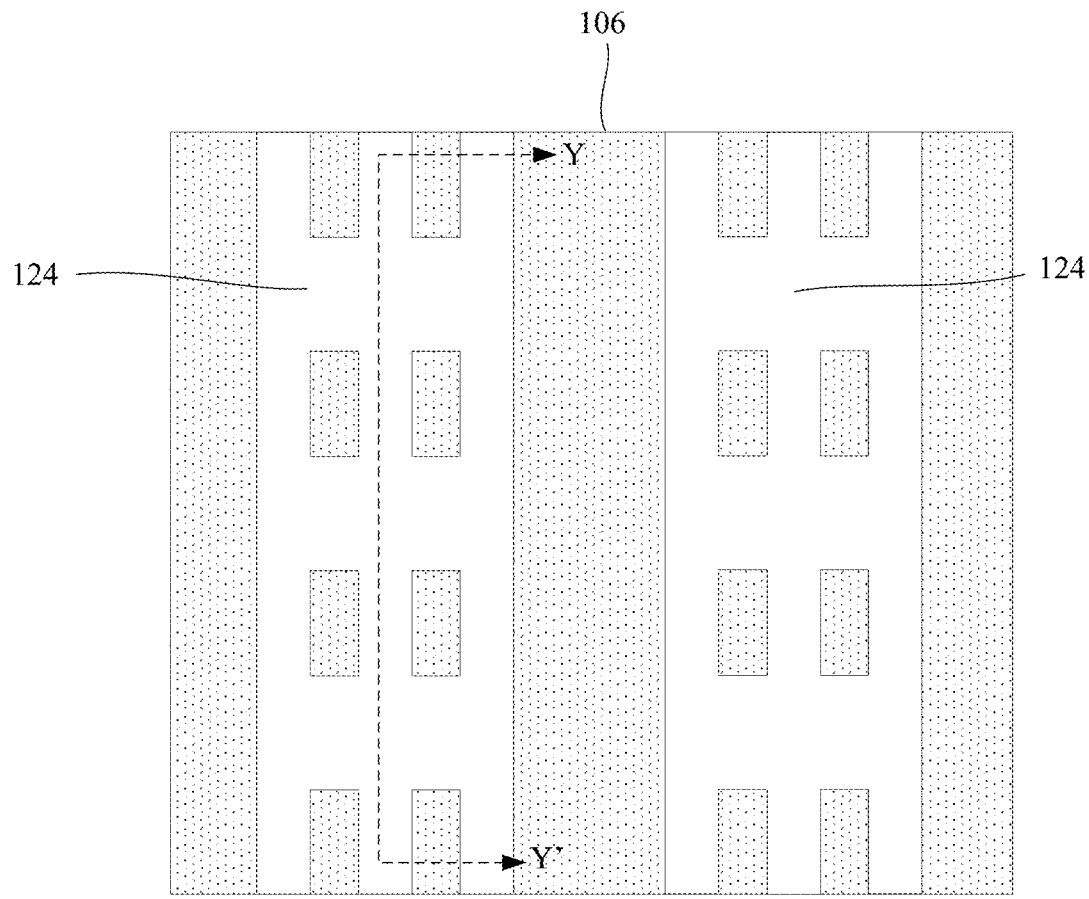
FIG. 6A is a top-down view and FIG. 6B is a cross-sectional view depicting the patterning of a dielectric region of the device structure shown in FIGS. 5A and 5B.
Figure 6B:
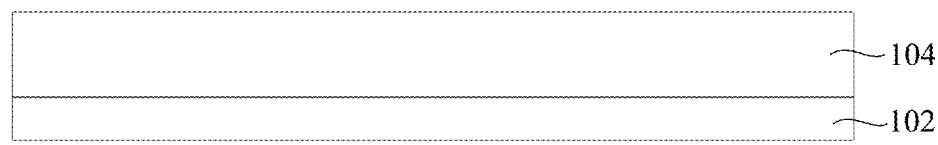

Referring to FIG. 6A and FIG. 6B (FIG. 6A continues from the embodiment shown in FIG. 5A, and FIG. 6B continues from the embodiment shown in FIG. 5B), the dielectric region 106 may be patterned to form a trench opening 124 in the dielectric region 106 using the patterning techniques described herein.

Figure 7A:
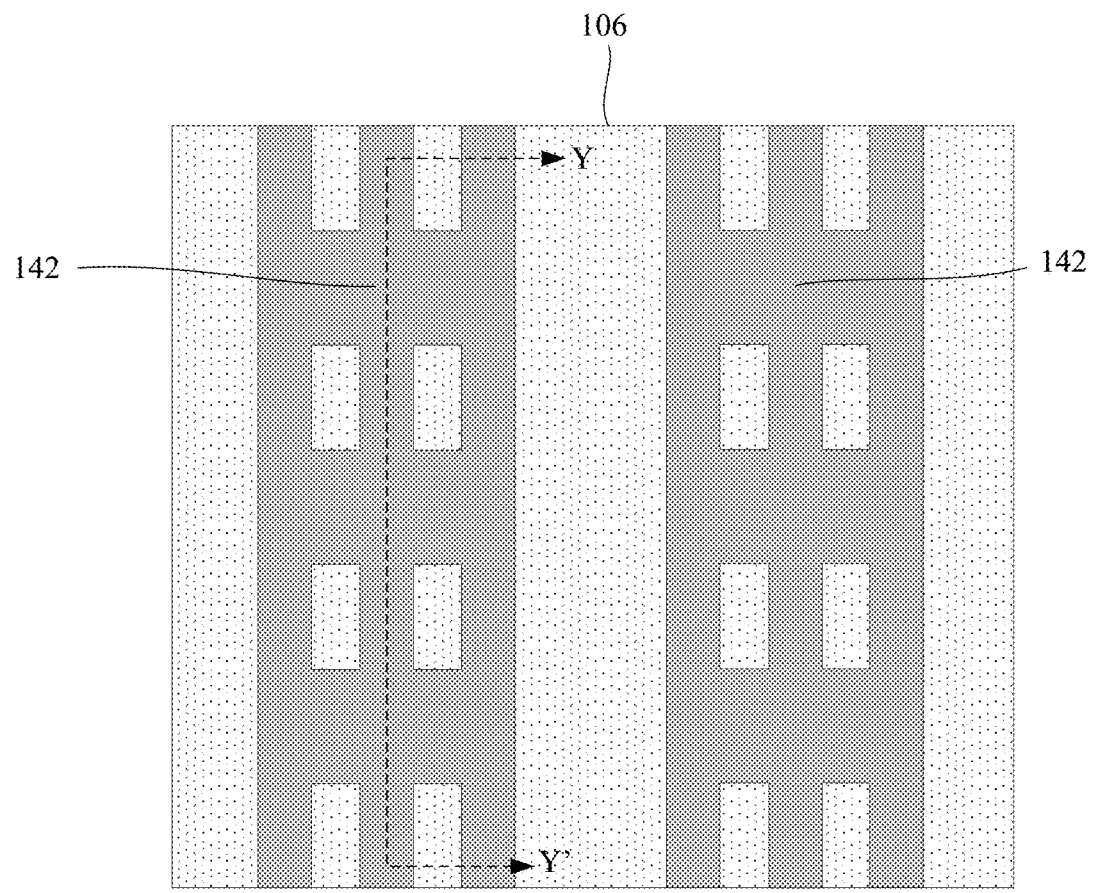
FIG. 7A is a top-down view and FIG. 7B is a cross-sectional view depicting the formation of a conductive material in the patterned dielectric region shown in FIGS. 6A and 6B.
Figure 7B:
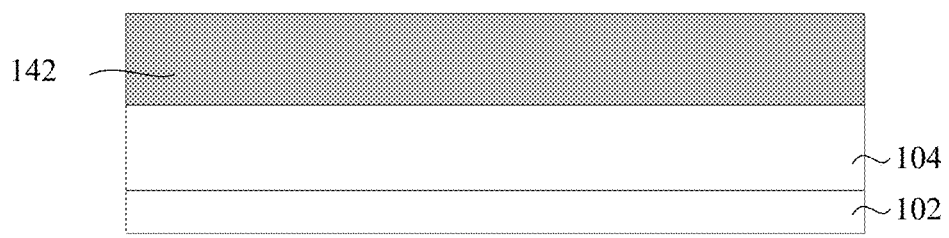

Referring to FIG. 7A and FIG. 7B (FIG. 7A continues from the embodiment shown in FIG. 6A, and FIG. 7B continues from the embodiment shown in FIG. 6B), a conductive material 142 may be formed in the patterned dielectric region 106. For example, the conductive material such as polycrystalline silicon may be deposited to fill up the trench opening 124 using the deposition techniques described herein.

Figure 8A:
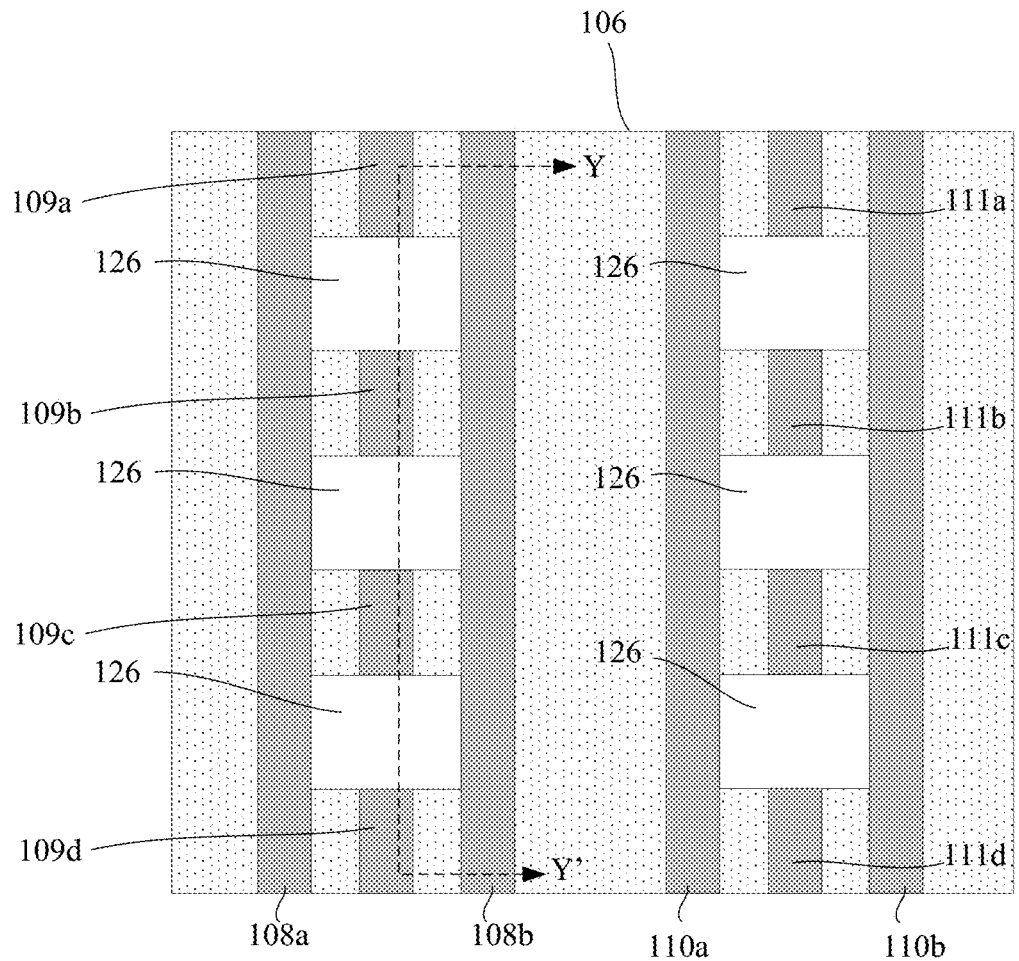
FIG. 8A is a top-down view and FIG. 8B is a cross-sectional view depicting the patterning of the conductive material shown in FIGS. 7A and 7B.
Figure 8B:
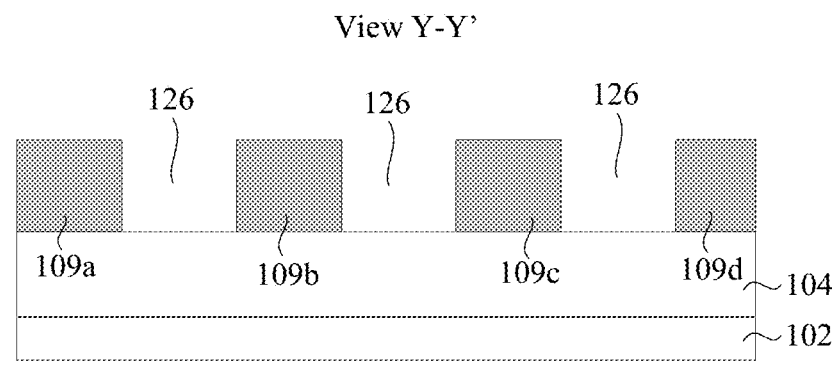

Referring to FIG. 8A and FIG. 8B (FIG. 8A continues from the embodiment shown in FIG. 7A, and FIG. 8B continues from the embodiment shown in FIG. 7B), the conductive material 142 may be patterned using the patterning techniques described herein. For example, the conductive material 142 may be patterned by etching using a dry etchant. The patterning of the conductive material 142 may form a first set of diffusion blocks 109a, 109b, 109c, 109d and a second set of diffusion blocks 110a, 110b, 110c, 110d. The first and second sets of diffusion blocks may be formed along a length of the isolation region 104.

The patterning of the conductive material 142 may also form gate openings 126 above the isolation region 104. The gate openings 126 may separate adjacent diffusion blocks. For example, a gate opening 126 may be formed in between every two diffusion blocks in the first set of diffusion blocks 109a, 109b, 109c, 109d and the second set of diffusion blocks 110a, 110b, 110c, 110d.

The patterning of the conductive material 142 may also simultaneously form diffusion structures 108a, 108b, 110a, 110b that extend along the length of the isolation region 104. The first set of diffusion blocks 109a, 109b, 109c, 109d may be formed between a first diffusion structure 108a and a second diffusion structure 108b, and the second set of diffusion blocks 110a, 110b, 110c, 110d may be formed between a third diffusion structure 110a and a fourth diffusion structure 110b.

To fabricate the device structures shown in FIGS. 4A-4C, doped regions (not shown in FIG. 8A and FIG. 8B) may be formed in the diffusion structures 108, 109, 110, 111. The doped regions may be formed using various doping techniques, such as an ion implantation process with the use of a mask and a dopant of a conductivity type as described herein.

Figure 9A:
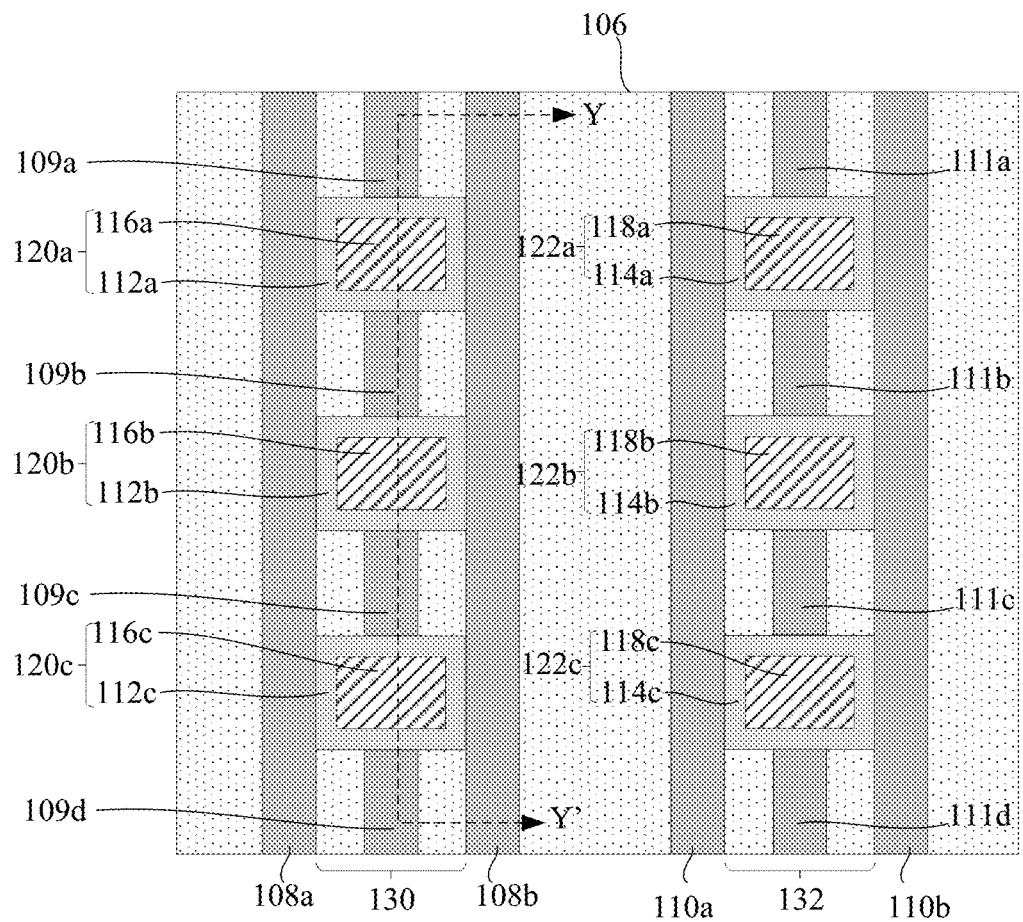
Figure 9B:
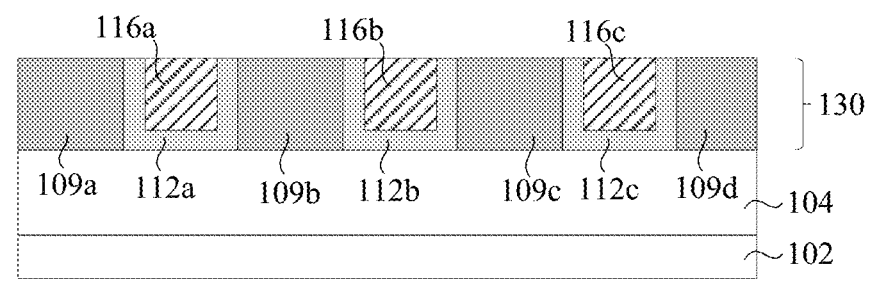

Referring to FIG. 9A and FIG. 9B (FIG. 9A continues from the embodiment shown in FIG. 8A, and FIG. 9B continues from the embodiment shown in FIG. 8B), gates 120a, 120b, 120c, 122a, 122b, 122c are formed in the gate openings 126. In particular, a dielectric layer 112a, 112b, 112c, 114a, 114b, 114c may be deposited in each of the gate openings 126 using the deposition techniques described herein, and preferably, using a conformal deposition process, such as an ALD process or a highly-conformal CVD process. The deposited dielectric layer in each gate opening 126 may contact adjacent diffusion structures and diffusion blocks. For example, dielectric layer 116a contacts the diffusion structures 108a, 109a, and diffusion blocks 109b, 108b.

A gate structure 116a, 116b, 116c, 118a, 118b, 118c may be formed on the respective dielectric layers 112a, 112b, 112c, 114a, 114b, 114c using techniques employed in replacement metal gate (RMG) processes. As shown in FIG. 9A, the gate structures 116a, 116b, 116c, 118a, 118b, 118c may be peripherally enclosed by each respective dielectric layer 112a, 112b, 112c, 114a, 114b, 114c. As shown in FIG. 9B, the dielectric layers 112a, 112b, 112c may conform to sides and a bottom of the respective gate structures 116a, 116b, 116c.

It should be understood that the RMG process is described at this point in the sequence as an example. The RMG process will be apparent to those of ordinary skill in the art without departing from the scope and spirit of this disclosure.

Accordingly, a first row 130 of gates 120a, 120b, 120c and diffusion blocks 109a, 109b, 109c, 109d, and a second row 132 of gates 122a, 122b, 122c and diffusion blocks 111a, 111b, 111c, 111d are formed. In the first row 130 and the second row 132, the gates and the diffusion blocks may be formed along the length of the isolation region 104, and each gate may be arranged between two diffusion blocks. The first row 130 may be formed between the first diffusion structure 108a and the second diffusion structure 108b, and the second row 132 may be formed between the third diffusion structure 110a and the fourth diffusion structure 110b.

To form the structure shown in FIG. 2, interconnect structures such as conductive line and interconnect vias may be formed to connect to the gates 120, 122, the diffusion blocks 109, 111, and the diffusion structures 108, 110. The interconnect structures may be formed using semiconductor processes, such as a damascene process.

Figure 10:
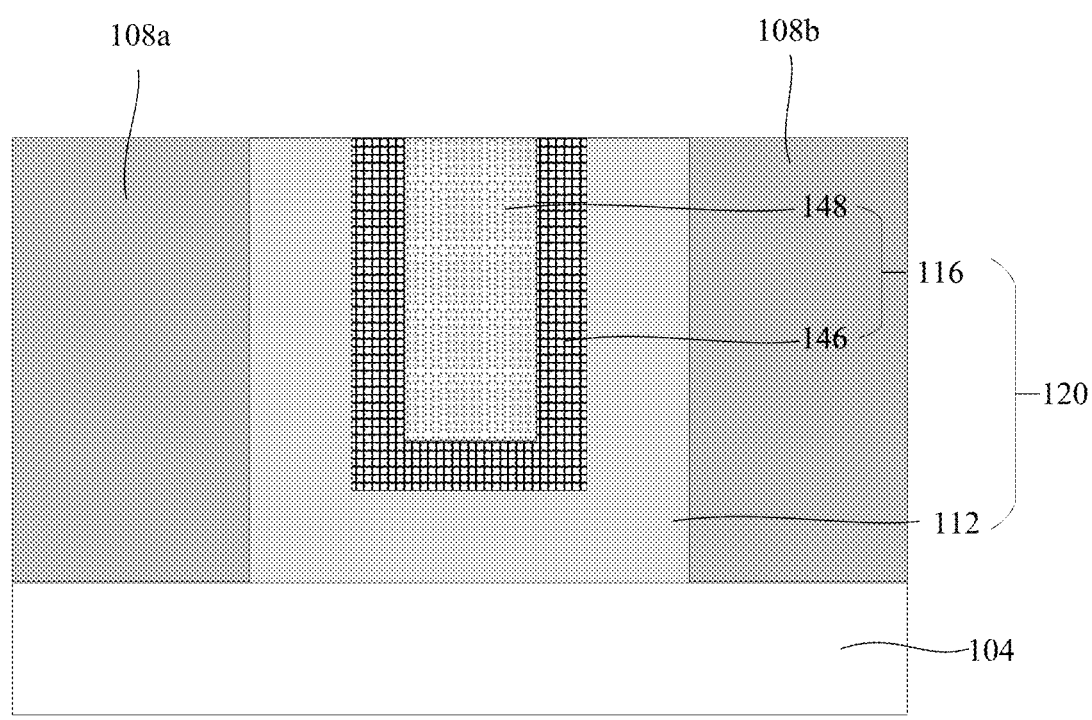
FIG. 10 is a cross-sectional view depicting an exemplary arrangement of the components in a gate, in accordance with embodiments of the present disclosure.

As described herein, the gate structure 116 may include a metal electrode and a WFM component. FIG. 10 illustrates an exemplary arrangement of the metal electrode 148 and the WFM component 146 in the gate structure 116. The WFM component 146 may be formed on the dielectric layer 112. The metal electrode 148 may be formed on the WFM component 146. Formation of the metal electrode 148 and the WFM component 146 may be performed using the deposition techniques described herein.

It is understood that the following disclosure is not limited to any particular type of semiconductor device. The devices and methods disclosed herein may be applied to any type of semiconductor device architecture, such as tri-gate field-effect transistor (FET) devices, fin-type FET (FinFET) devices or planar-type metal-oxide-semiconductor FET (MOSFET) devices.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the disclosed semiconductor devices and methods of forming the same may be employed in manufacturing a variety of different integrated circuit products, including, but not limited to, memory cells, NV memory devices, FinFET transistor devices, CMOS devices, etc.

What is claimed is:

1. A semiconductor device comprising:
an isolation region on a substrate;
a first row of gates and diffusion blocks on the isolation region, wherein each gate is arranged between two diffusion blocks and comprises a dielectric layer conforming to sides and a bottom of a gate structure, and wherein the dielectric layer contacts the two diffusion blocks in the first row; and
a first diffusion structure and a second diffusion structure on the isolation region, the first and second diffusion structures extending along a length of the isolation region, wherein the first row of gates and diffusion blocks are arranged between the first diffusion structure and the second diffusion structure, and wherein the dielectric layer of each gate contacts the first diffusion structure and the second diffusion structure.

2. The device of claim 1, wherein the first diffusion structure, the second diffusion structure, and each diffusion block in the first row include at least one doped region that is in contact with the dielectric layer of each gate in the first row.

3. The device of claim 1, wherein the two diffusion blocks that contact the dielectric layer of each gate in the first row are connected to different conductive lines.

4. The device of claim 3, further comprising:
a first source line connected to the first diffusion structure;
a second source line connected to a first of the two diffusion blocks in the first row;
a third source line connected to a second of the two diffusion blocks in the first row; and
a fourth source line connected to the second diffusion structure.

5. The device of claim 4, wherein each gate in the first row is connected to a word line and being configured to receive a voltage to control an electrical characteristic of at least one of the diffusion structures and the diffusion blocks that is in contact with the dielectric layer of each gate.

6. The device of claim 3, further comprising
a second row of gates and diffusion blocks located on the isolation region, wherein each gate is arranged between two diffusion blocks and comprises a dielectric layer conforming to sides and a bottom of a gate structure, and wherein the dielectric layer contacts the two diffusion blocks in the second row;
a third diffusion structure and a fourth diffusion structure on the isolation region and extending along the length of the isolation region, wherein the second row of gates and diffusion blocks are arranged between the third diffusion structure and the fourth diffusion structure, and wherein the dielectric layer of each gate in the second row contacts the third diffusion structure and the fourth diffusion structure; and
a conductive line that connects one of the gates in the first row and one of the gates in the second row.

7. The device of claim 6, further comprising:
a first source line connected to the first diffusion structure;
a second source line connected to a first of the two diffusion blocks in the first row;
a third source line connected to a second of the two diffusion blocks in the first row;
a fourth source line connected to the second diffusion structure
a fifth source line connected to the third diffusion structure;
a sixth source line connected to a first of the two diffusion blocks in the second row;
a seventh source line connected to a second of the two diffusion blocks in the second row;
an eighth source line connected to the fourth diffusion structure; and
a word line connected to one of the gates in the first row and one of the gates in the second row.

8. The device of claim 7, wherein the word line extends perpendicularly across the first row and the second row.

9. A semiconductor device comprising:
an isolation region on a substrate;
a gate on the isolation region, the gate comprises a dielectric layer conforming to sides and a bottom of a gate structure; and
two diffusion blocks and two diffusion structures on the isolation region, wherein the gate is arranged between the two diffusion structures and the two diffusion blocks, and wherein the dielectric layer contacts the diffusion structures and diffusion blocks.

10. The device of claim 8, wherein the diffusion structures and diffusion blocks are connected to different conductive lines and the gate is configured to receive a voltage to control an electrical characteristic of at least one of the diffusion structures and diffusion blocks that contacts the dielectric layer of the gate.

11. The device of claim 9, wherein the gate is connected to a word line and the diffusion structures and diffusion blocks are connected to different source lines.

12. The device of claim 9, wherein the gate is connected to a source line and the diffusion structures and diffusion blocks are connected to different word lines.

13. The device of claim 8, wherein each diffusion structure and each diffusion block include at least one doped region that is in contact with the dielectric layer of the gate.

14. The device of claim 8, wherein the gate structure is peripherally enclosed by the dielectric layer.

15. The device of claim 14, wherein the sides of the gate structure provides at least 4 facets.

16. The device of claim 14, wherein the sides of the gate structure provides at least 4 edges.

17. The device of claim 14, wherein the sides of the gate structure provides at least 2 facets and at least 2 edges.

18. The device of claim 14, wherein the sides of the gate structure form a circumferential surface.

19. A method of forming a semiconductor device comprising:
forming an isolation region on a substrate;
forming a first row of gates and diffusion blocks on the isolation region, wherein each gate is formed between two diffusion blocks and comprises a dielectric layer that conforms to sides and a bottom of a gate structure, and wherein the dielectric layer contacts the two diffusion blocks in the first row; and
forming a first diffusion structure and a second diffusion structure on the isolation region, the first and second diffusion structures extending along a length of the isolation region, wherein the first row of gates and diffusion blocks are formed between the first diffusion structure and the second diffusion structure, and the dielectric layer of each gate contacts the first diffusion structure and the second diffusion structure.

20. The method of claim 19, further comprising forming at least one doped region in the first diffusion structure, the second diffusion structure, and each diffusion block in the first row, wherein the doped region contacts the dielectric layer of each gate in the first row.

\* \* \* \* \*